(12) United States Patent
Wu

(10) Patent No.: US 7,008,882 B2
(45) Date of Patent: Mar. 7, 2006

(54) METHOD AND STRUCTURE FOR THE ADHESION BETWEEN DIELECTRIC LAYERS

(75) Inventor: Hsin-Chang Wu, Hsin-Chu (TW)

(73) Assignee: United Microelectronics Corp., (TW)

( * ) Notice: Subject to any disclaimer, the term of this patent is extended or adjusted under 35 U.S.C. 154(b) by 0 days.

(21) Appl. No.: 10/722,394

(22) Filed: Nov. 28, 2003

(65) Prior Publication Data

US 2005/0118799 A1    Jun. 2, 2005

(51) Int. Cl.
*H01L 21/31* (2006.01)
(52) U.S. Cl. .................. 438/778; 438/788; 438/790
(58) Field of Classification Search ................ 438/778, 438/788, 790
See application file for complete search history.

(56) References Cited

U.S. PATENT DOCUMENTS 6,251,770 B1 * 6/2001 Uglow et al. .............. 438/624
6,362,091 B1 * 3/2002 Andideh et al. ........... 438/624
6,663,973 B1 * 12/2003 Lee et al. .................. 428/447
6,740,539 B1 * 5/2004 Conti et al. ................ 438/99
6,812,043 B1 * 11/2004 Bao et al. .................. 438/4

* cited by examiner

*Primary Examiner*—Trung Dang

(57) ABSTRACT

A method for forming an adhesion between dielectric layers, it includes forming a first dielectric layer and forming a second dielectric layer having a first portion and a second portion. The first portion is on the first dielectric layer and the second portion is on the first portion. The first portion and second portion are formed by an in-situ method. The first portion has at least one of the following a dielectric constant, hardness or SiCH3/SiO area ratio, which is higher than the second portion. A structure of enhanced-inter-adhesion dielectric layers includes a first dielectric layer and a second dielectric layer having a first portion on the first dielectric layer, and a second portion on the first portion. Herein, the first portion has a dielectric constant around 2.8 to 3.5 higher than second portion.

15 Claims, 2 Drawing Sheets

METHOD AND STRUCTURE FOR THE ADHESION BETWEEN DIELECTRIC LAYERS

BACKGROUND OF THE INVENTION

1. Field of the Invention

The present invention generally relates to fabrication and structure of dielectric layers, and more particularly to a method and a structure for the adhesion enhancement between dielectric material and low-k material.

2. Description of the Prior Art

As device scaling continues to reduce feature size, the gain in device speed at the gate level is offset by propagation delays at metal material interconnects due to the increased RC time constant. And the propagation delay can be reduced by the incorporation of low-k (low dielectric constant) materials. The use of low-k material also lowers power consumption and reduces transistor's crosstalk.

Future technology nodes will require materials with a progressively lower dielectric constant in order to meet performance goals. Normally a dielectric constant bellow 3.7 is called low-k material. By the year 2003, the effective dielectric constant for the inter-level dielectric (ILD) will be between 2.2 and 2.9 (for technology nodes between 130 nm and 100 nm) requiring extreme low-k materials with a bulk dielectric constant as low as 2.0.

Carbide and nitride applying to the barrier layer have found the widest application in ILD layers partly because of the familiarity and varied methods for deposition carbide or nitride layers pervasive in the semiconductor manufacturing processes. Carbide/nitride as ILD layers can be deposited by any number of processes, including chemical vapor deposition (CVD), plasma enhanced CVD (PECVD) and liquid spin-on glass forming techniques, tailored to achieving high-quality ILDs characterized by good electrical and physical properties.

A conventional approach in forming ILDs involves depositing a dielectric layer and a low-k layer. Surly, a couple of layers without low-k you can design, but ultimately you must integrate it. After depositing, the planarization is treated by a chemical-mechanical polishing (CMP), to provide a substantially flat upper surface on which additional layers are formed. And then the delamination occurs between the dielectric layer and the low-k layer. It also causes the degradation which is due to bond breaking and loss of hydrogen and/or methyl groups contained in such materials when oxygen or oxygen radicals react with the surface of the low-k layer.

An embodiment as shown in FIG. 1. Before the trench open in forming Cu damascene process: Firstly, the Cu layer 101 is formed. Next, the silicon nitride (SiN) layer 102 is formed on the Cu layer 101 for blocking Cu expansion. Then forming a low-k material, such as a carbon doped oxide (CDO) layer 103, on the silicon nitride (SiN) layer 102. Because it has a poor adhesion between silicon nitride (SiN) layer 102 and carbon doped oxide (CDO) layer 103, and the following steps may include one or more steps of chemical-mechanical polishing (CMP), other etch process or other deposition process. After these steps, the delamination easily occurs between the silicon nitride (SiN) layer 102 and the carbon doped oxide (CDO) layer 103.

Thus, there exists a need for improving adhesion between a dielectric layer and a low-k layer. The following provides a method and a structure for it.

SUMMARY OF THE INVENTION

In view of the prior art, there are many disadvantages if the delamination is happens between the dielectric layer and low-k layer. Because of this reason, we provide a method and structure for improving adhesion between a dielectric layer and a low-k layer.

One reason of this invention involves a method and structure for forming an adhesion between dielectric layers. An in-situ method can provide a low-k material with good adhesion at the same time.

A method for forming an adhesion between dielectric layers includes forming a first dielectric layer and a second dielectric layer having a first portion and a second portion. The first portion is on the first dielectric layer and the second portion is on the first portion. The first portion and second portion are formed by an in-situ method. The first portion has at least one of the following a dielectric constant, hardness or SiCH3/SiO area ratio, which is higher than the second portion. A structure of enhanced-inter-adhesion dielectric layers includes a first dielectric layer and a second dielectric layer having a first portion on the first dielectric layer, and a second portion on the first portion. Herein, the first portion has a dielectric constant around 2.8 to 3.5 higher than second portion.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
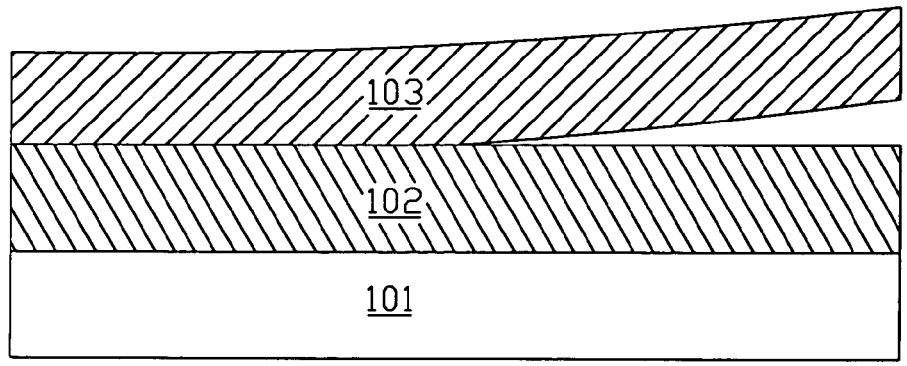
FIG. 1 shows the schematically cross-sectional accordance with the prior art.

Before describing the invention in detail, a brief discussion of some underlying concepts will first be provided to facilitate a complete understanding of the invention.

Integration of low-k materials is intimately related to optimizing different tradeoffs between material properties. The major factor of material properties for determining the future of low-k material integration is dielectric constant. Mechanical strength is another important factor for the successful application of low-k interlayer dielectrics (ILD). It is perhaps the lowest dielectric constant materials with reasonable mechanical strength. However problems with adhesion, plastic creep and thermal stability have hindered its use in electronic applications.

There would be relationships among the dielectric constant, hardness and the SiCH3/SiO area ratio. It is known that if the dielectric constant continues to increase, then the hardness and SiCH3/SiO area ratio may increase as well. Moreover, if the dielectric constant increases then the adhesion may as well. According to these relationships, when the low-k material raises the dielectric constant, the hardness and SiCH3/SiO area ratio do as well, and so does adhesion. For semiconductor processes, however, it is not intended to raise the dielectric constant too much. So, keeping dielectric constant low with good adhesion will be the reason of this invention.

Some sample embodiments of the invention will now be the present invention could be practiced in a wide range of others. And it is to be understood and appreciated that the process steps and structures described below do not cover a complete process flow and structure. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

A method for forming an adhesion between dielectric layers includes forming a first dielectric layer and forming a second dielectric layer having a first portion and a second portion. The first portion is on the first dielectric layer and the second portion is on the first portion. The first portion and second portion are formed by in-situ method. The first portion has at least one of the following a dielectric constant, hardness or SiCH3/SiO area ratio, which is higher than the second portion. A structure of enhanced-inter-adhesion dielectric layers includes a first dielectric layer and a second dielectric layer having a first portion on the first dielectric layer, and a second portion on the first portion. Herein, the first portion has a dielectric constant around 2.8 to 3.5 higher than second portion.

Figure 2:
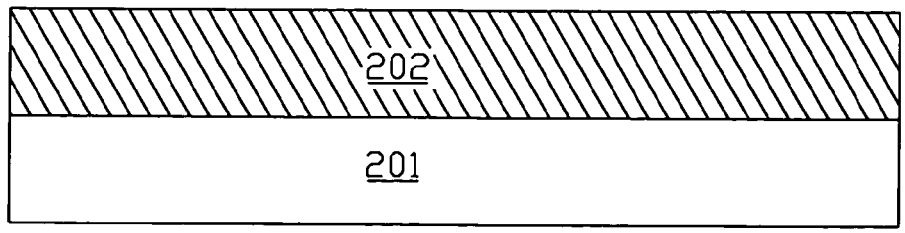
FIG. 2 shows the schematically cross-sectional diagram of general dielectric layer on metal layer accordance with one embodiment of the present invention.

FIG. 2 is a cross-sectional diagram of the forming first dielectric layer on a semiconductor structure in accordance with this invention. One of the embodiments is applied, but not limited, on a damascene process. In a preferred embodiment, a semiconductor structure (not shown) is provided for fabricating metallization interconnects thereon. A Cu layer 201 is on the semiconductor structure and then a dielectric layer is formed on the Cu layer 201. It is noted that there is no limitation for the first step previous mentioned. For instance, it can be a traditional Al process.

In the preferred embodiment, the first dielectric layer 202, such as a silicon nitride (SiN) layer, is formed on and next to the Cu layer 201 for blocking Cu expansion. The first dielectric layer 202 also can be carbide or nitride. Generally, the first dielectric layer is a conventional barrier layer. Thus, in the present invention, the first dielectric layer 202 has a dielectric constant higher than the following layer, second dielectric layer has.

Figure 3:
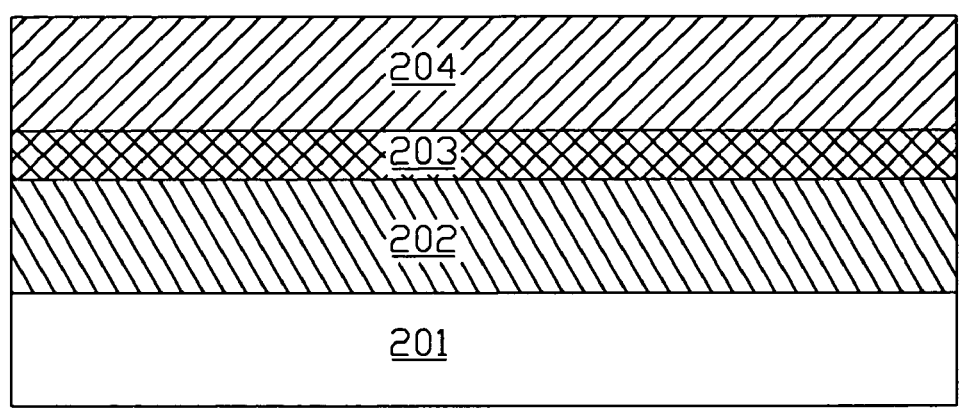
FIG. 3 shows the schematically cross-sectional diagram of low-k layer on general dielectric layer accordance with one embodiment of the present invention.

FIG. 3 shows a cross-sectional diagram of the forming second dielectric layer on first dielectric layer in accordance with this invention. The second dielectric layer, such as a carbon doped oxide layer (CDO) with a dielectric constant smaller than the first dielectric layer, consists of an initial portion 203 and a bulk portion 204. Of course, it also can be other low-k material, such as MSSQ, SiLK and Porosity etc. One of the features of the present invention is that the initial portion 203 and the bulk portion 204 are formed by an in-situ deposition method. The initial portion 203 is formed on the first dielectric layer 202 and the bulk portion 204 is on the initial portion 203. One of the features in the present invention is that the in-situ formed initial portion 203 provides good adhesion between the first dielectric layer 202 and the in-situ formed bulk portion 204. Thus, the delamination between the second dielectric layer and the first dielectric layer 202 can be prevented during or after the integrated processes. As the forgoing mentioned, this invention method provides enhanced-inter-adhesion structure of dielectric layer without the issue of delamination.

Furthermore, one of the features in the present invention, the in-situ formed initial portion 203 has a higher dielectric constant than the in-situ formed bulk portion 204. In one embodiment, the initial portion 203 has a dielectric constant in the range of about 2.8 to 3.5, while the bulk portion 204 has one in the range of about 1.1 to 3. On the other hand, the thickness of the initial portion 203 can be around 10 Angstroms or less, it depends on the limitation of the apparatus. However, the bulk portion 204 has a thickness much thicker than the initial portion 203 does. So as the second dielectric layer has a total dielectric constant lower than the first dielectric layer 202. Furthermore, for providing the good adhesion and a low dielectric constant as well, the initial portion 203 has a SiCH3/SiO area ratio less than 3 (measured by FT-IR).

In accordance with this invention, the in-situ deposition method is implemented by adjusting the parameters for the formation of the initial portion 203 and the bulk portion 204. In one embodiment, the in-situ deposition method, such as plasma enhanced chemical vapor deposition (PECVD) is executed with a pressure of around 6 torr and the CO2 flow rate of around 5000 sccm. During the in-situ deposition, a HFRF (High Frequency Ratio Frequency) power is between around 900 and 1500 watts for the formation of the initial portion 203, and afterward it is back to normal deposition (e.g. the power lowered) for the formation of the bulk portion 204. Accordingly, one kind of driving forces, such as raising HFRF power or bias or reducing the amount of a precursor but not limited, is executed for the formation of the initial portion 203 so as to get the initial portion 203 having strong adhesion strength.

Table 1 shows the tested results of the formed dielectric layers according with this invention and of the formed dielectric layers according with the prior art. It is tested by the 4-point bending technique and the Gc value is higher is good. By comparing the results, the Gc value of this invention is almost twice as large as prior art, and which means the adhesion of this invention is much better than prior art.

TABLE 1

Adhesion results using 4-point bending technique

|  |  | Adhesion of 4-point bending (Gc, J/m2) |
|---|---|---|
| The invention | SiN/(initial + bulk) | 9.1 |
|  | SiC/(initial + bulk) | 10.1 |
| Prior art | SiN + low-k | 4.5 |
|  | SiN + low-k | 4.4 |

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for forming an adhesion between dielectric layers, the method comprising:
   providing a first dielectric layer; and
   in-situ forming a first portion of a second dielectric layer on said first dielectric layer, and a second portion of said second dielectric layer on said first portion, wherein said first portion has a dielectric constant in the range of about 2.8 to 3.5 and a thickness that is less than about 10 angstroms, said second portion has a dielectric constant in the range of 1.1 to 3 and a thickness that is thicker than said thickness of said first portion, and said first portion comprises carbon therein.

2. The method according to claim 1, wherein the in-situ forming step has at least a process condition for forming said first portion and said second portion.

3. The method according to claim 2, wherein the in-situ forming step having said process condition comprises:
   executing a chemical vapor deposition having a first bias; and
   executing said chemical vapor deposition having a second bias, wherein said first bias is higher than said second bias.

4. The method according to claim 2, wherein the in-situ forming step having said process condition comprises:
   executing a chemical vapor deposition having a first HFRF for forming said first portion; and
   executing said chemical vapor deposition having a second HFRF, wherein said first HFRF is higher than said second HFRF.

5. The method according to claim 2, wherein the in-situ forming step having said process condition comprises:
   executing a chemical vapor deposition having a first precursor for forming said first portion; and
   executing said chemical vapor deposition having a second precursor, wherein the amount of said first precursor is less than the amount of said second precursor.

6. The method according to claim 1, wherein the in-situ forming step comprises plasma enhanced chemical vapor deposition (PECVD).

7. A method for forming an adhesion between dielectric layers, the method comprising:
   providing a first dielectric layer; and
   in-situ forming a second dielectric layer having a first portion on said first dielectric layer and a second portion on said first portion, wherein said first portion has a dielectric constant in the range of about 2.8 to 3.5 and a thickness that is less than about 10 angstroms and said second portion has a dielectric constant in the range of about 1.1 to 3, said first portion has a hardness higher than that of said second portion, and said first portion comprises carbon.

8. The method according to claim 7, wherein said first dielectric layer has a dielectric constant which is higher than said second dielectric layer.

9. The method according to claim 7, wherein the in-situ forming step at least comprises:
   executing a chemical vapor deposition having a first bias for forming said first portion; and
   executing said chemical vapor deposition having a second bias for forming said second portion, wherein said first bias is higher than said second bias.

10. The method according to claim 7, wherein the in-situ forming step at least comprises:
    executing a chemical vapor deposition having a first HFRF for forming said first portion; and
    executing said chemical vapor deposition having a second HFRF for forming said second portion, wherein said first HFRF is higher than said second HFRF.

11. The method according to claim 7, wherein the in-situ forming step comprises:
    executing a chemical vapor deposition having a first process condition; and
    executing said chemical vapor deposition having a second process condition, wherein said second process condition forming said second portion having a dielectric constant smaller than said first process condition forming said first portion.

12. The method according to claim 11, wherein said executing said chemical vapor deposition is plasma enhanced chemical vapor deposition (PECVD).

13. A structure of enhanced-inter-adhesion dielectric layers, the structure comprising:
    a first dielectric layer; and
    a second dielectric layer having a first portion on said first dielectric layer and a second portion on said first portion, wherein said first portion has a dielectric constant in the range of about 2.8 to 3.5 and higher than a dielectric constant of said second portion which is in the range of about 1.1 to 3, and the thickness of said first portion is less than about 10 angstroms which is less than the thickness of said second portion.

14. The structure according to claim 13, wherein said first dielectric layer is silicon nitride (SiN).

15. The structure according to claim 13, wherein said first dielectric layer is silicon carbide (SiC).

* * * * *